United States Patent
Hara et al.

(10) Patent No.: US 6,700,053 B2
(45) Date of Patent: Mar. 2, 2004

(54) THERMOELECTRIC MODULE

(75) Inventors: Reiko Hara, Atsugi (JP); Ikuto Aoyama, Hiratsuka (JP); Kenichi Tomita, Hirakata (JP); Kouichi Ishida, Hiratsuka (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 09/894,120

(22) Filed: Jun. 29, 2001

(65) Prior Publication Data

US 2002/0024154 A1 Feb. 28, 2002

(30) Foreign Application Priority Data

Jul. 3, 2000 (JP) .......................... 2000-201380

(51) Int. Cl.$^7$ .......................... H01L 35/30; H01L 35/28; H01L 35/12; H01L 35/08
(52) U.S. Cl. ................. 136/205; 136/203; 136/236.1; 136/237; 252/62.3 T
(58) Field of Search ................ 136/203, 205, 136/237, 236.1; 252/62.3 T

(56) References Cited

U.S. PATENT DOCUMENTS

| | | | | |
|---|---|---|---|---|
| 5,429,680 A | * | 7/1995 | Fuschetti | 136/203 |
| 5,610,366 A | * | 3/1997 | Fleurial et al. | 136/202 |
| 5,712,448 A | * | 1/1998 | Vandersande et al. | 136/203 |
| 5,912,429 A | * | 6/1999 | Imanishi et al. | 136/240 |
| 6,083,770 A | * | 7/2000 | Sato et al. | 257/467 |

FOREIGN PATENT DOCUMENTS

DE 4129867 * 3/1993

* cited by examiner

Primary Examiner—Patrick Ryan
Assistant Examiner—Thomas H. Parsons
(74) Attorney, Agent, or Firm—Varndell & Varndell, PLLC

(57) ABSTRACT

A thermoelectric module comprising an N-type thermoelectric element having excellent characteristics in air atmosphere even when the temperature rises to a medium-to-high temperature region of about 500° C. and, further, improving the conversion efficiency of, a thermoelectric module, by the combination of an excellent P-type thermoelectric material and an excellent n-type thermoelectric material containing a compound having a skutterudite structure, the module comprising an N-type thermoelectric elements each containing a compound having a skutterudite structure, P-type thermoelectric elements each connected directly or by way of a metal member to the N-type thermoelectric elements and containing an Mn—Si series compound.

42 Claims, 11 Drawing Sheets

HEAT FLOW

THERMOELECTRIC MODULE

BACKGROUND OF THE INVENTION

1. Field of the Invention

This invention concerns a thermoelectric module for generating electric power by utilizing the temperature difference and, vice versa, generating temperature difference in accordance with electric power applied.

2. Description of the Related Art

The thermoelectric module comprises a combination of P-type and N-type thermoelectric elements that utilize thermoelectric effects such as the Thomson effect, Peltier effect and Seebeck effect, and includes thermo-couples or electronic cooling elements. Since the thermoelectric module is simple in structure, easy to handle, and can maintain stable characteristics, it has been noted for the use in a wide range of applications. Particularly, as an electronic cooling element, since it can perform local cooling or precision temperature control near the room temperature. Research and development have been progressed generally for using a thermoelectric module for temperature control of opto-electronics devices or semiconductor lasers, as well as for small-sized refrigerators.

The figure of merit Z representing the performance of thermoelectric materials is expressed by the following equation using electrical resistivity $\rho$, thermal conductivity $\kappa$, and Seebeck coefficient $\alpha$:

$$z = \alpha^2/\rho\kappa \tag{1}$$

In the equation, the Seebeck coefficient a takes a positive value in the P-type materials and a negative value in the N-type materials. A larger figure of merit Z is desired for the thermoelectric materials.

Further, the maximum value $\eta_{max}$ for the conversion efficiency of the thermoelectric materials is represented by the following equation.

$$\eta_{max} = \frac{\Delta T}{T_h} \frac{M-1}{M + \frac{T_c}{T_h}} \tag{2}$$

where $T_h$ is a temperature on the high temperature side, $T_c$ is a temperature on the lower temperature side and the difference of the temperature $\Delta T$ is represented by the following equation:

$$\Delta T = T_h - T_c \tag{3}$$

Further M is defined by the following equations (4) to (7).

$$M = \sqrt{\overline{ZT} + 1} \tag{4}$$

$$\overline{ZT} = \overline{Z} \times \overline{T} \tag{5}$$

$$\overline{Z} = \frac{\int_{T_c}^{T_h} Z dT}{\Delta T} \tag{6}$$

$$\overline{T} = \frac{T_c + T_h}{2} \tag{7}$$

As materials used for the P-type thermoelectric element, Mn—Si series materials disclosed in the paper article of V. K. Zaitsev (Thermoelectric Engineering Handbook, p299–309, published from CRC in 1995) have high conversion efficiency of about 11% at 650° C. Further, the report by Matsubara (Proceedings of Thermoelectric Conversion Symposium '97 (TEC '97), Thermoelectric Conversion Study Group, Jul. 25, 1997) discloses the use of compounds having the skutterudite structure as the material for the P-type element. The term "skutterudite" is derived from minerals $CoAs_3$ produced in Skutterud, that is, the name of a district in Norway. The literature describes that $CoSb_3$, $RhSb_3$ and $IrSb_3$, which have the skutterudite structure, are P-type semiconductors having inherent band structures and carrier transport characteristics. $CoSb_3$, $RhSb_3$ and $IrSb_3$ also have a feature in that the hole mobility is large, such as from 2000 to 3000 $cm^2/Vs$ at a room temperature. P-type $Zn_4Sb_4$ used so far is fragile, and its usable temperature is low. $Ce(FeCo)_4Sb_{12}$ is also fragile and tends to be oxidized in an air atmosphere at 500° C. or higher. Further, the SiGe series and FeSi series materials involve a problem of low figure of merit.

On the other hand, in order to construct an excellent thermoelectric module, not only excellent P-type thermoelectric element but also excellent N-type thermoelectric element are required. Heretofore, the Mg—Si—Sn series, SiGe series, FeSi series, Pb—Te series or Pb—Se series materials have been used as the N-type thermoelectric element.

However, the N-type $Mg_2$ (Si—Sn) tends to be oxidized in an air atmosphere at a temperature of 500° C. or higher. The Pb—Te series or Pb—Se series materials have a worry of giving undesirable effects on environments. Further, the SiGe series and the FeSi series materials involve a problem of low figure of merit

SUMMARY OF THE INVENTION

In view of the above, this invention intends to provide a thermoelectric module using N-type thermoelectric elements having excellent characteristics in an air atmosphere even when the temperature rises to a medium-to-high temperature region of about 500° C. and, further, to improve the conversion efficiency of a thermoelectric module by the combination of an excellent P-type thermoelectric material and an excellent n-type thermoelectric material.

For solving the foregoing problem, this invention provides a thermoelectric module comprising N-type thermoelectric elements each containing a compound having a skutterudite structure and P-type thermoelectric elements each containing an Mn—Si series compound and connected directly or through a metallic component to the N-type thermoelectric elements.

This invention also provides a thermoelectric module comprising an insulator in which a plurality of openings are formed in a lattice configuration, N-type thermoelectric elements each containing a compound having a skutterudite structure and disposed in a first opening of the insulator, P-type thermoelectric elements each containing an Mn—Si series compound and disposed in a second opening of the insulator, and a metal member for connecting the N-type thermoelectric element and the P-type thermoelectric element.

According to this invention, since a compound having a skutterudite structure is used for the N-type thermoelectric element, excellent characteristics can be obtained in an air atmosphere even at a temperature of around 500° C. As the material for the N-type thermoelectric element, for example, an Co—Sb series compound can be used. Further, when the Mn—Si series compound is used as the material for the P-type thermoelectric element, the conversion efficiency of a thermoelectric module can be improved by the combination of the excellent P-type thermoelectric material and the excellent N-type thermoelectric material.

DESCRIPTION OF PREFERRED EMBODIMENTS

A preferred embodiments of this is invention is illustrated in the accompanying drawings.

Figure 1:
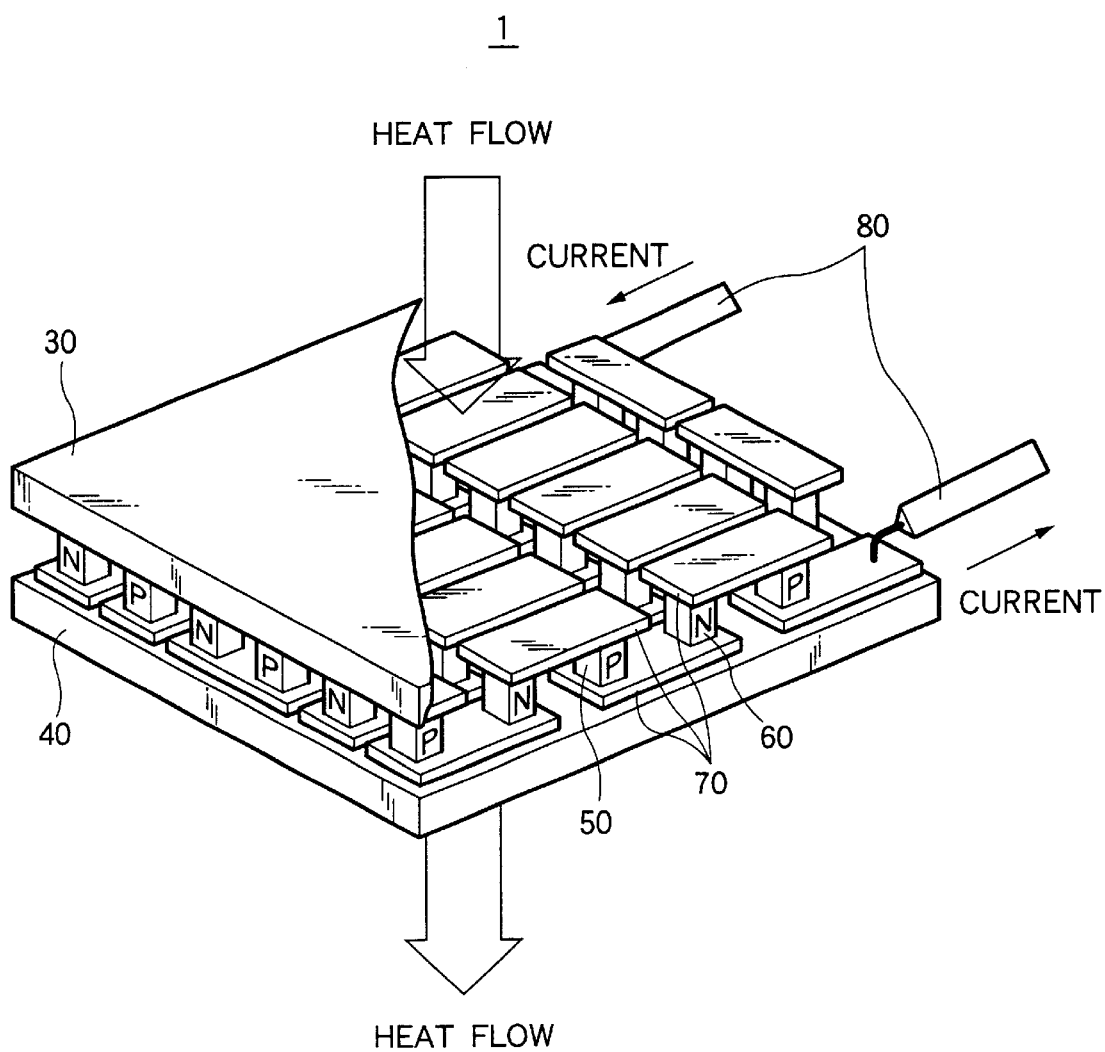
FIG. 1 is a view illustrating a thermoelectric module related to a first embodiment of this invention.

FIG. 1 illustrates a thermoelectric module according to a first embodiment of this invention. A thermoelectric module 1 comprises, for example, two ceramic plates 30 and 40 as electrical insulator (thermal conductor). A P-type element (P-type semiconductor) 50 and an N-type element (N-type semiconductor) 60 are connected by a metallic component, for example, an electrode 70 arranged between the two ceramic plates 30 and 40, to form PN element pair. The metal member includes electrodes made of copper or nickel or other electric conductor material, a stress relaxation layer, a joining layer or a diffusion prevention layer. For joining the thermoelectric element and the metal member, soldering can be used in a case of a thermoelectric module for low temperature using copper as the metal member, but they should be joined, in other cases than described above, by brazing, thermal spraying, solid-phase welding (sintering), vapor deposition or mechanical clamping.

Lead wires 80 are connected to the N-type element at one end of the PN element pair and the P-type element at the other end thereof. When the ceramic plate 40 is cooled by cooling water or the like and the ceramic substrate 30 is heated, an electromotive force is generated to cause a flow of current as shown in FIG. 1. That is, electric power can be taken out by making a temperature difference between both sides of the thermoelectric module 1 (upper and lower sides in the drawing).

In FIG. 1, the P-type elements and the N-type elements are connected by using electrodes formed on the two ceramic plates but, as described below, the electrodes or the plates can be omitted in whole or in part. This will be explained with reference to FIG. 2.

Figure 2A:
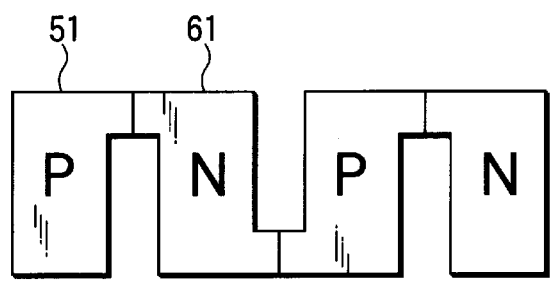
FIGS. 2A, 2B, and 2C are views illustrating a modified example of a thermoelectric module related to the first embodiment of this invention.

FIG. 2A shows an example of connecting a P-type element 51 with an N-type element 61 not using an electrode. As shown in the figure, by forming a recess to each portion of the P-type element 51 and the N-type element 61, a current can be prevented from short circuiting. In this case, electrodes on both sides or one side can be omitted and substrates on both sides or one side canal so be omitted.

Figure 2B:
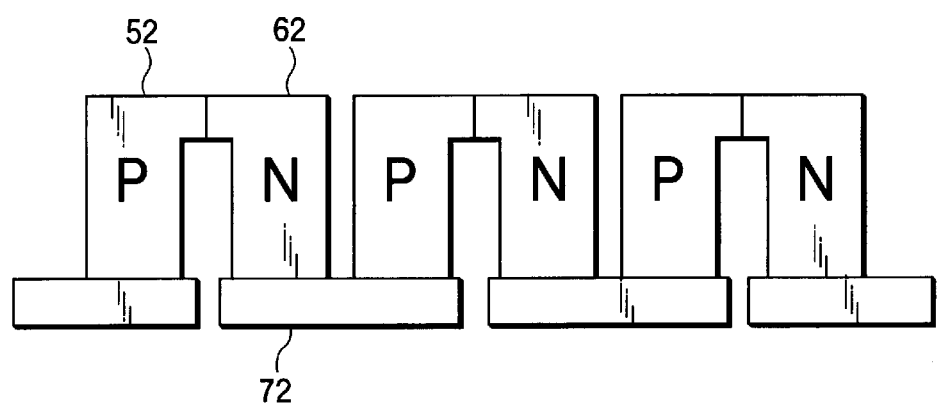

FIG. 2B shows an example of connecting a P-type element 52 and an N-type element 62 by using a metal member, for example, electrode 72 on one side (lower side in the drawing) and connecting the P-type element 52 and the N-type element 62 by not using an electrode on the other side (upper side in the drawing). Also in this constitution, a recess is formed to each portion of the P-type element 52 and the N-type element 62. In this case, electrode on one side can be saved and the plate on one side can also be saved.

Figure 2C:
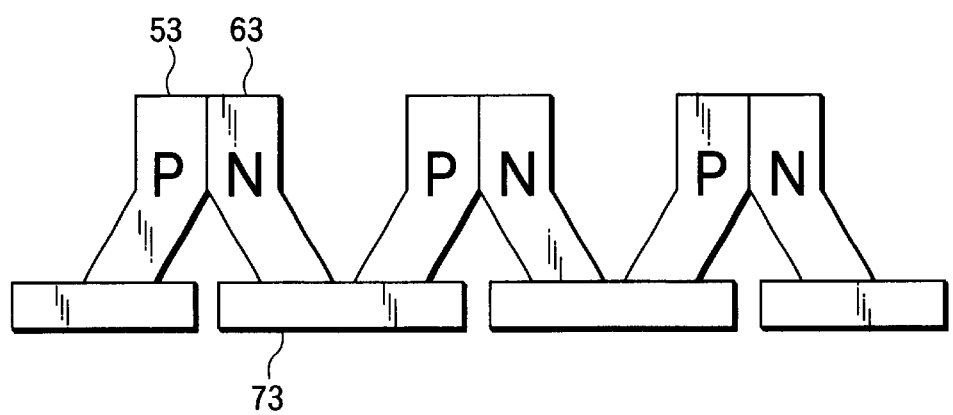

FIG. 2C also shows an example of connecting a P-type element 53 and an N-type element 63 by using a metal member, for example, an electrode 73 on one side and connecting the P-type element 53 with the N-type element 63 without the electrode on the other side. In this constitution, each of the P-type element 53 with the N-type element 63 has a curved shape. Also in this case, electrode on one side can be and the plate on one side can also be omitted.

In the explanation of FIGS. 2A to 2C, when the P-type element and the N-element are connected without using the electrode, this constitution includes both a case of directly connecting the elements to each other and a case of connecting them by way of a joining layer or a diffusion prevention layer between the elements.

Figure 3:
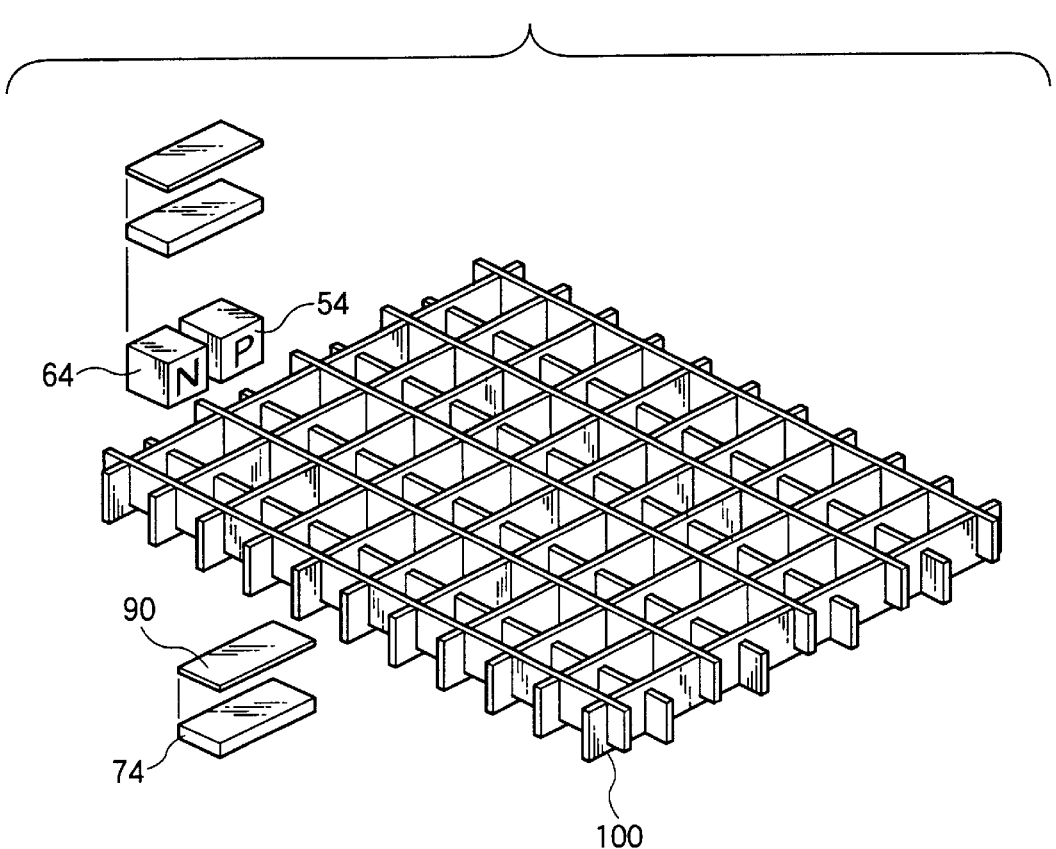
FIG. 3 is a view for assembling a thermoelectric module manufactured by thermal spraying.
Figure 4:
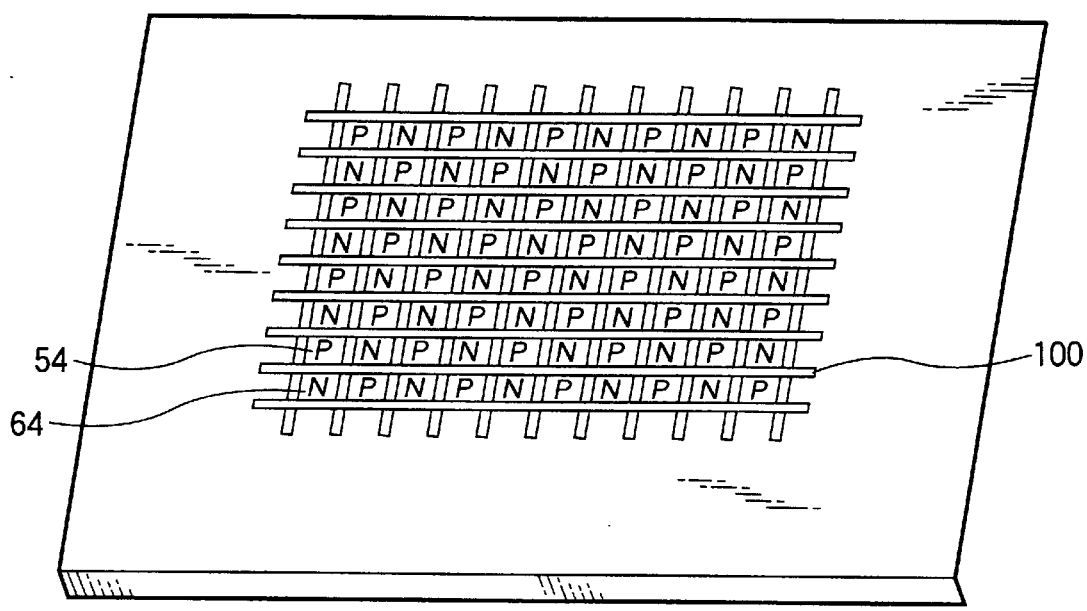
FIG. 4 is a perspective view showing an example of an arrangement of P-type elements and N-type elements in the thermoelectric module shown in FIG. 3.

Manufacture of the thermoelectric module by thermal spraying is a described with reference to FIGS. 3, 4, and 5A to 5D. The same reference numbers are used in these figures to identify the same structure. FIG. 3 is an assembly drawing of a thermoelectric module manufactured by thermal spraying. P-type elements 54 and N-type elements 64 are arranged in a lattice 100 of an insulator provided with a level difference, which is shown in FIG. 4. A metal member 74 or 90 is made by thermal spraying thereon.

The manufacturing processes for the thermoelectric module by thermal spraying is to be explained with reference to FIGS. 5A to 5D.

Figure 5A:
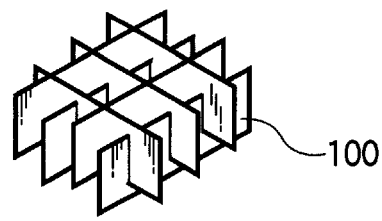
FIGS. 5A, 5B, 5C and 5D are perspective views showing a portion of the thermoelectric module in FIG. 3 along manufacturing process.
Figure 5B:
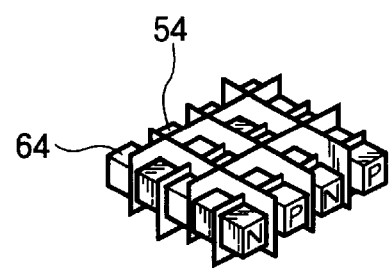
Figure 5C:
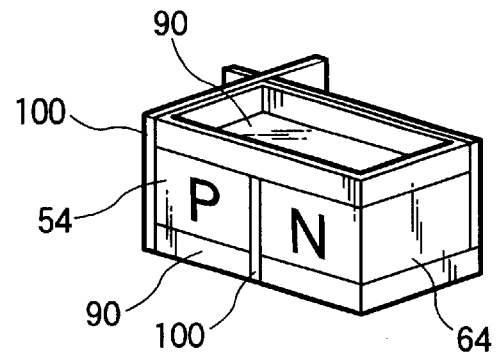
Figure 5D:
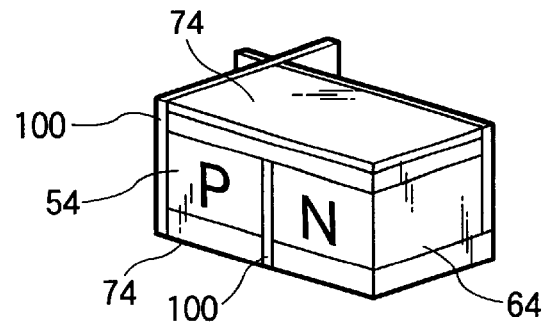

At first, as shown in FIG. 5A, a level different lattice 100 is prepared from an insulator such as alumina ceramics. Then, as shown in FIG. 5B, P-type elements 54 and N-type elements 64 are arranged in the opening of the insulator lattice 100. Then, as shown in FIG. 5C, a metal member 90 is made by thermal spraying so as to connect adjacent elements. Further, as shown in FIG. 5D, a metal member 74 is made by thermal spraying from above the metal member 90 to form a metal layer of single or plural layer structure.

In the thermoelectric module, since the lattice is applied with level difference as shown in FIG. 5A, the adjacent elements are connected by the metallic component made by thermal spraying as shown in FIG. 5C.

Figure 6:
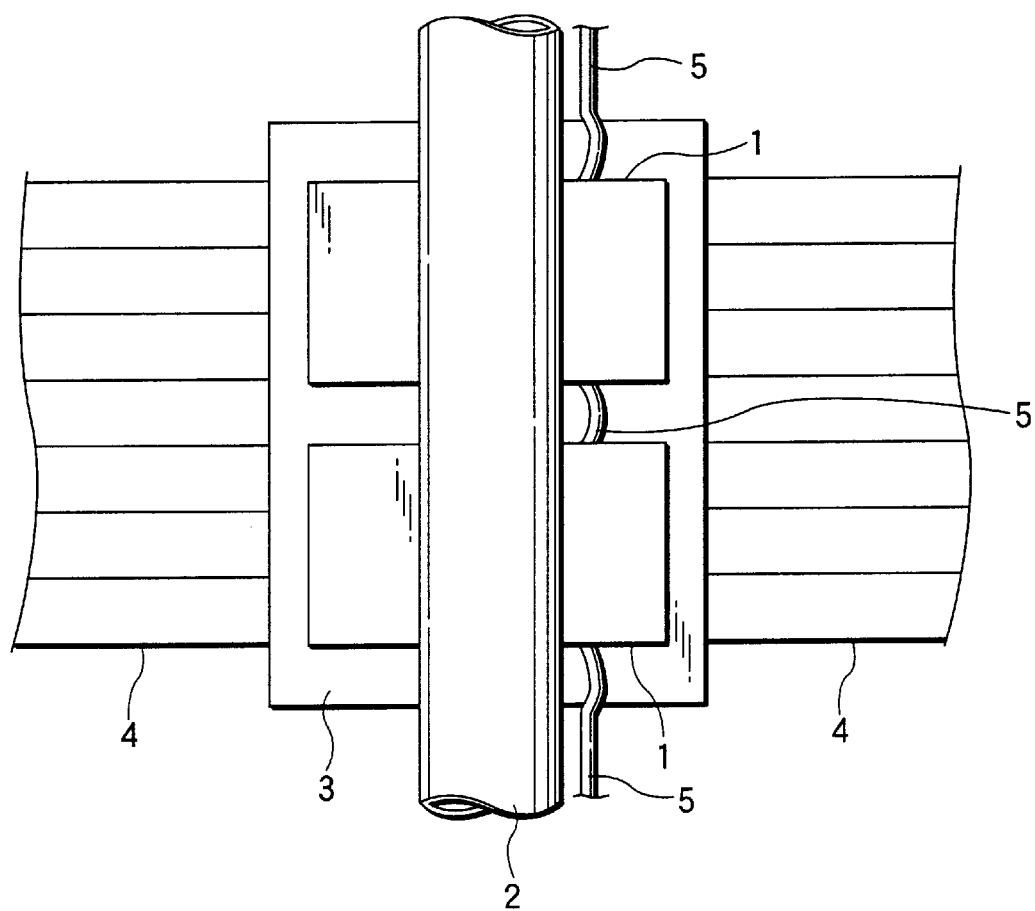
FIG. 6 is a view illustrating a power generation unit using the thermoelectric module related to the first embodiment of this invention.

When the thermoelectric module as explained above is used as a thermoelectric power generation unit, as shown in FIG. 6, for example, a cooling pipe 2 is arranged on one ceramic plate of a thermoelectric module 1 (ceramic plate on low temperature side). The cross section of the cooling pipe 2 perpendicular to the longitudinal direction has a circular or rectangular shape, and the ceramic plate on the low temperature side is cooled by flowing cooling water in the pipe. On the other hand, a metal plate 3 for absorbing heat is arranged to the other ceramic plate plate of the thermoelectric module 1 (ceramic plate on high temperature side). The heat collecting effect can be enhanced by integrally forming heat collecting fins 4 to the metal plate 3 or by separately forming and connecting them. Further, a plurality of thermoelectric modules 1 are connected by lead wires 5. Electric power can be taken out from the thermoelectric modules by the temperature difference between the high temperature side and the low temperature side.

In this invention, a compound having a skutterudite structure is used as the material for the N-type element. Particularly, the compound having the following composition is suitable as the material for the N-type element.

(1) Compound represented by $M_{1-A}M'_A X_B$

Figure 7:
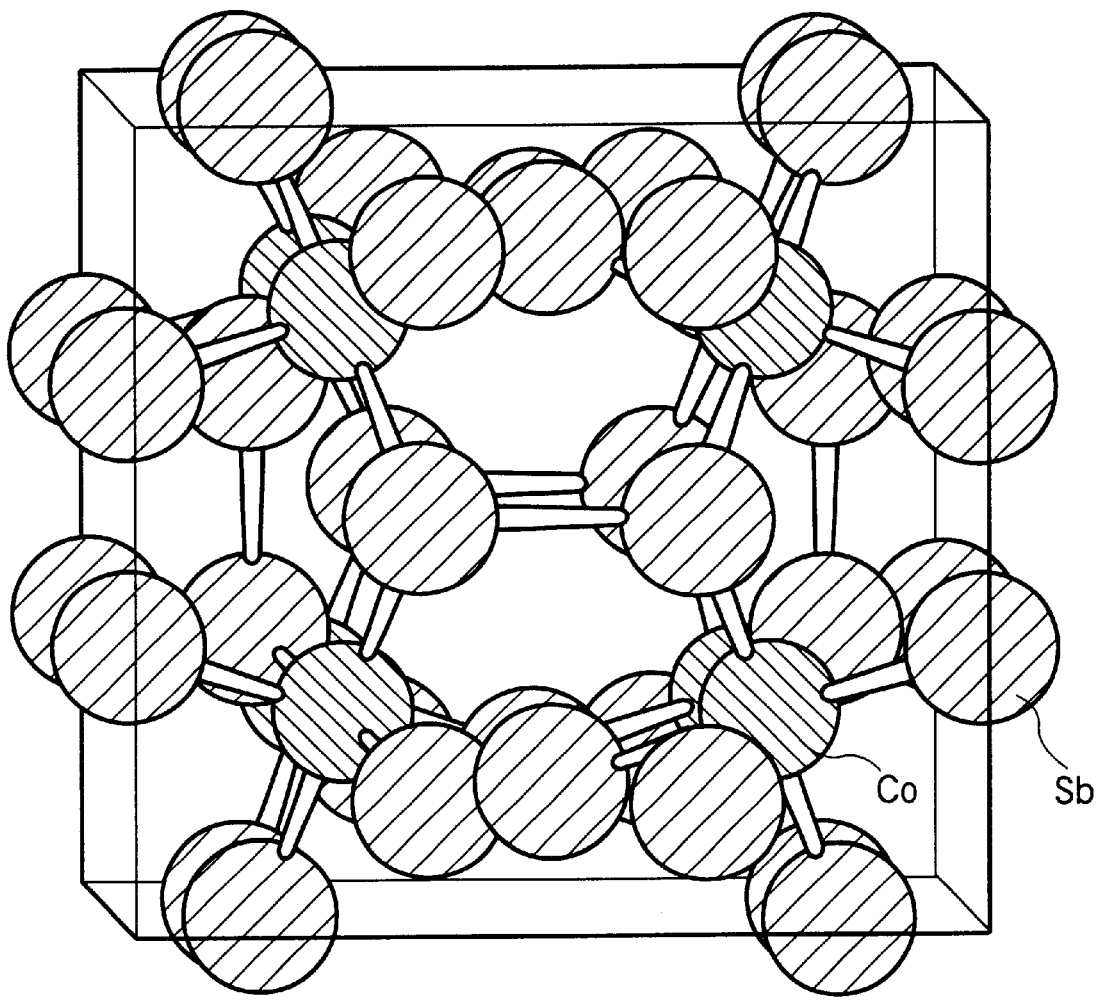
FIG. 7 shows a model of a crystal structure of $CoSb_3$ used in the first embodiment of this invention.

M represents one of Co, Rh and Ir, and M' represents a dopant to form an N-type material, which represents one of Pd, Pt, and PdPt, X represents one of As, P and Sb. Those satisfying the conditions: $0 < A \leq 0.2$ and $2.9 \leq B \leq 4.2$ are suitable. Particularly, a compound of a simple compositional ratio can be obtained at B=3. Specific examples can include Co—Sb series compounds, for example, $Co_{0.9}(PdPt)_{0.1}Sb_3$. Explanation is to be made with reference to FIG. 7 illustrating a crystal structure of Co—$Sb_3$ having the same structure as $Co_{0.9}(PdPt)_{0.1}Sb_3$. This crystal structure is referred to as a skutterudite structure. As shown in FIG. 7, the unit lattice of $CoSb_3$ is a cubic lattice containing 32 atoms in total of 8 Co atoms and 24 Sb atoms. The Co atom situates at the center of the octahedron of Sb atoms formed by six Sb atoms. Eight octahedrons of Sb atoms are present in one unit lattice. The eight octahedrons form a polyhedral plate which has 20 planes of Sb atoms. Vacant cages where atoms are not present are formed at the center and the corner of the unit lattice.

(2) Compound represented by $M(X_{1-A}X'_A)_3$

M represents one of Co, Rh and Ir, X represents one of As, P and Sb and X' represents one of Te, Ni and Pd. Those satisfying the condition: $0 < A \leq 0.1$ are suitable.

(3) Compound represented by $M_{1-A}M'A (X_{1-B}X'_B)_C$

M represents one of Co, Rh and Ir, M' is a dopant for forming N-type material and represents one of Pd, Pt and PdPt, X represents one of As, P and Sb and X' represents one of Te, Ni and Pd. Those satisfying the conditions: $0 < A \leq 0.2$, $0 \leq B < 0.1$ and C=3 are suitable.

By using the materials as described above, a thermoelectric module using N-type elements is provided that is difficult to oxidize in the late air atmosphere even at a temperature around 500° C. The N-type element also has a relatively high strength and relatively mild to environment can be attained.

Figure 8:
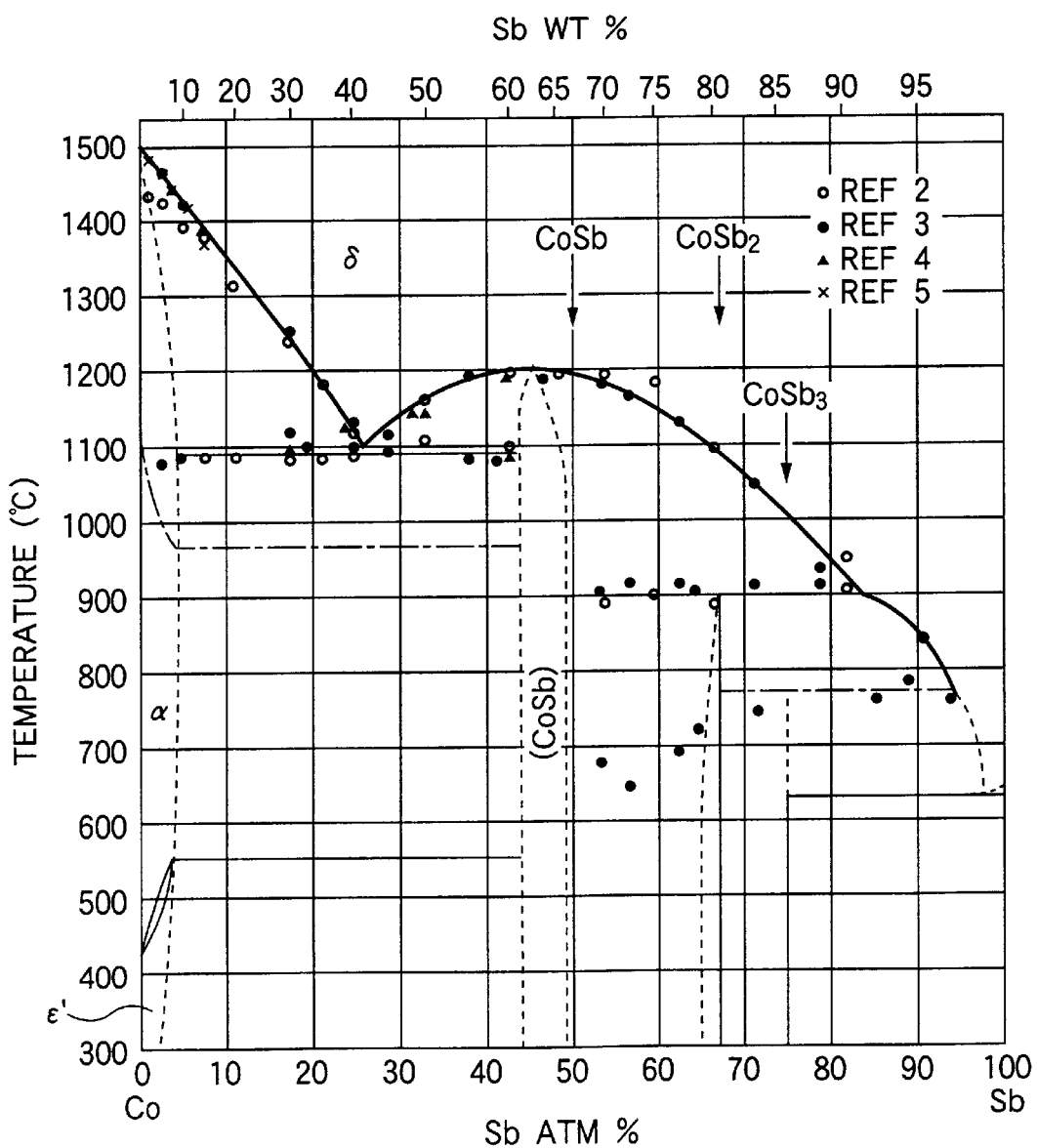
FIG. 8 is a phase diagram of a Co—Sb series compound used in an N-type element.

Among the materials described above, the Co—Sb series compounds are difficult to manufacture and can not provide satisfactory characteristics easily, since a single phase can not be obtained simply as can be judged from the phase diagram of FIG. 8. As a result of trying various manufacturing methods, several manufacturing methods comprising a combination of solid phase welding, explosive welding, MA (Mechanical Alloying), SPS (Spark Plasma Sintering), HP (Hot Press), annealing and plastic forming show an actual effect for obtaining the Co—Sb series single phase compounds.

One or plurality of diffusion prevention layers are preferably disposed as an intermediate layer between each of the thermoelectric elements or between the thermoelectric element and the metal member for preventing inter-diffusion of atoms. Since the linear expansion coefficient is generally different between the materials used for the thermoelectric element and for the electrode when used in a medium-to-high temperature region around 500° C., one of them expands more to cause thermal stresses to be likely to peel the joined surface or form cracks in the thermoelectric element. In view of the above, the material used for the diffusion preventive layer is desirably selected while taking the linear expansion coefficient thereof into consideration.

For example, when a Co—Sb series material is used for the N-type element and copper is used for the electrode, a diffusion preventive layer having a linear expansion coefficient greater than the linear expansion coefficient of $8 \times 10^{-6}$/K (800 K) of the Co—Sb series materials and lower than the linear expansion coefficient of $20 \times 10^{-6}$/K (800 K) of copper can be used. When the diffusion coefficient, thermal conductivity, electrical resistivity and Young's modulus are also taken into consideration as the factors other than the linear expansion coefficient, it is preferred to use Nb, V, Cr, Ti, Rh, Pt, Zr, W, Ta, Mo, Ni, Cu, Fe, Ag, Au, Sb and an alloy containing them as a first intermediate layer (layer just above the thermoelectric element). Among these, Mo, Ta or Cr is particularly suitable.

The intermediate layer, such as the diffusion preventive layer can comprise a single layer or plural layers. When plural intermediate layers are disposed, thermal stresses can be relaxed or destressed by gradually increasing the linear expansion coefficient of them from the thermoelectric element to the electrode.

As the electrode to be connected electrically with the N-type element, Ag, Al, Au, Co, Cu, Fe, Pt, Ti, Zn, Ni and alloy containing them is used preferably. Cu, Ni and Fe are particularly preferred. The linear expansion coefficients of them are respectively $16.5 \times 10^{-6}$/K, $13.3 \times 10^6$/K and $11.7 \times 10^6$/K at room temperature, for example, which are smaller when compared with the linear expansion coefficient of Al ($23.9 \times 10^6$/K), and near the linear expansion coefficient of the thermoelectric element.

Further, an electrode holding layer may be disposed on the surface of the electrode that is opposite side of the thermoelectric element. It is preferred that the electrode holding layer is formed of a material of smaller linear expansion coefficient. The thermal stress can be reduced by sandwiching the electrode between an intermediate layer having small linear expansion coefficient and the electrode holding layer having small linear expansion coefficient. As the material for the electrode holding layer, ceramics using $Al_2O_3$ or AlN as the raw material, glass using $SiO_2$ as a raw material, Cr, Nb, Pt, Rh, Si, Ta, Ti, V, Mo, W, Zr and an alloy containing them can be used.

The thickness of the intermediate layer is preferably about at the same as the thickness of the electrode (1:1). Specifically, the thickness for the intermediate layer or the electrode is preferably from 5 μm to 1000 μm and, further preferably, from 50 μm to 300 μm. As described previously, the intermediate layer may be a multi-layered structure. It may also be constituted such that the electrode is sandwiched between the intermediate layer and the electrode holding layer.

On the other hand, as the material for the P-type element, an Mn—Si series compound can be used this embodiment. Particularly, compounds having the following compositions are suitable as the materials for the P-type element.

(1) $MnSi_A$
where $1.72 \leq A \leq 1.75$.

(2) Compounds in which one or more of Ge, Sn, Mo and Al is added by 0 to 5 atm % as the dopant to $MnSi_A$.

For example, $Mn_{1-B}Mo_BSi_{A-C-D}Ge_CAl_D$ can be mentioned. The relation may be $0<B$, C, $D \leq 0.1$.

Figure 9:
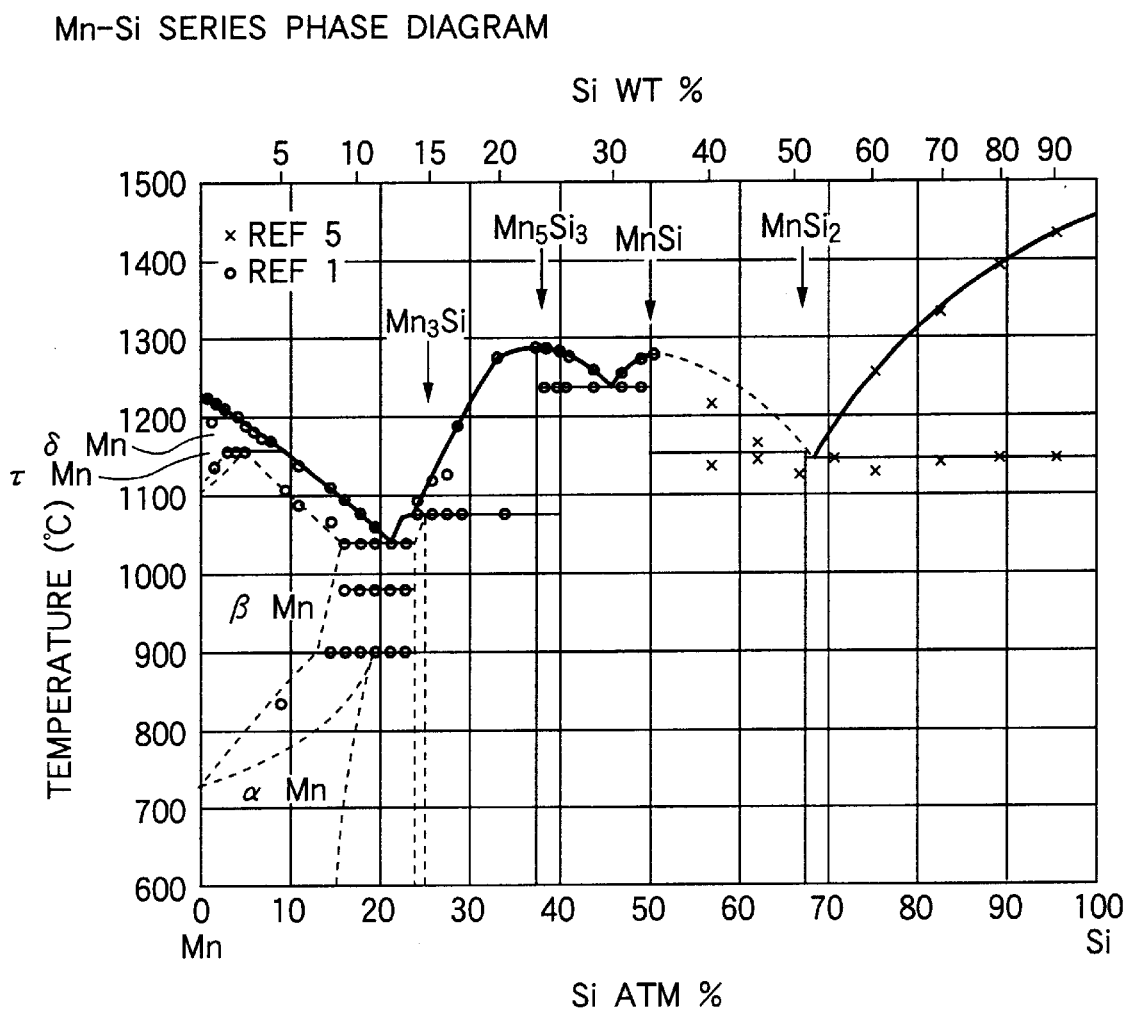
FIG. 9 is a phase diagram of a Mn—Si series compound used in a P-type element.

Also for the Mn—Si series compounds used as the material for the P-type element, since a single phase can not be obtained easily as can be seen from the phase diagram in FIG. 9, they are difficult to manufacture and can not provide satisfactory characteristics easily. Then, several manufacturing methods comprising a combination of methods such as solid phase welding, explosive welding, MA, SPS, HP, annealing and plastic forming are effective also when the material for the P-type elements is manufactured.

Like the N-type element, it is also desirable for the P-type element to dispose one or plural of diffusion preventive layers between each of the thermoelectric elements or between the thermoelectric element and the metal member.

For, example, when the Mn—Si series material is used for the P-type element and copper is used for the electrode, a diffusion preventive layer having a linear expansion coefficient of greater than about the linear expansion coefficient of the Mn–Sn series material of $12 \times 10^{-6}$/K (800 K) and lower than about the linear expansion coefficient of copper of $20 \times 10^{-6}$/K (800 K). When the diffusion coefficient, thermal conductivity, electrical resistivity and Young's modulus also taken into consideration as the factors other than the linear expansion coefficient, it is preferred to use Nb, V, Cr, Ti, Rh, Pt, Zr, W, Ta, Mo, Ni, Cu, Fe, Ag, Au, Si and an alloy containing them as a first intermediate layer (layer just above the thermoelectric element). Among these, Nb, Mo, Ta, Pt or Cr is particularly suitable.

Further, the intermediate layer such as the diffusion preventive layer described above may be a single layer or multiple layers. When multiple intermediate layers are disposed, the thermal stress can be relaxed by gradually increasing the linear expansion coefficient of layers from the thermoelectric element to the electrode.

The electrode connected electrically with the P-type element can include, like the N-type element, Ag, Al, Au, Co, Cu, Fe, Pt, Ti, Zn, Ni and an alloy containing them. Cu, Ni and Fe are preferred particularly.

The thermal stress can be reduced by making the shape of the P-type and the N-type thermoelectric elements as a columnar, cylindrical or trapezoidal shape. Further, the thermal stress can be reduced by chamfering edges of a thermoelectric element having the columnar, cylindrical, trapezoidal or rectangular (solid) shape.

Further, an electrode holding layer may be disposed on the surface of the electrode opposite to the thermoelectric element. It is preferred that the electrode holding layer is formed of a material of small linear expansion coefficient. The thermal stress can be reduced by sandwiching an electrode between an intermediate layer having small linear expansion coefficient and the electrode holding layer having small linear expansion coefficient. As the material for the electrode holding material, ceramics using $Al_2O_3$ or AlN as the raw material, glass using $SiO_2$ as the raw material, Cr, Nb, Pt, Rh, Si, Ta, Ti, V, Mo, W, Zr and an alloy containing them can be used.

The thickness of the intermediate layer is preferably about the same as the thickness of the electrode (1:1). Specifically, the thickness for the intermediate layer or the electrode is preferably from 5 μm to 1000 μm and, further preferably, from 50 μm to 300 μm. As described previously, the intermediate layer may be a multi-layered structure. It may be constituted such that the electrode can be sandwiched between the intermediate layer and the electrode holding layer.

When a diffusion preventive layer is formed of an element which is identical for the P-type element and the N-type element, the diffusion preventive layer can be formed simultaneously for the P-type element and the N-type element, for example, by thermal spraying, which simplifies the manufacture of the thermoelectric module. For example, when $CoSb_3$ is used for the N-type element and $MnSi_{1.73}$ is used for the P-type element, V, Cr, Ti, Nb, Fe, Cu, Ni, Ta, W, Zr or Mo is used for the diffusion preventive layer and Cu, Ni, Fe or the like is preferably used for the electrode.

As the process of joining the thermoelectric element,( for example,) with an electrode, thermal spraying is particularly superior. For the joining process in a case of using the Co—Sb series compound for the thermoelectric element, the methods including brazing, thermal spraying, solid phase welding and vapor deposition were studied. As a result, vapor deposition involves a problem that the degree of adhesion is lowered. Further, in the case of brazing, while brazing materials having a melting point of about 600° C. is preferred for the Co—Sb series compound, there are only few brazing materials having such temperature region. Further, since melting point is different between the Co—Sb series compound used for the N-type element and the Mn—Si series compound used for the P-type element, if the brazing material is selected conforming the Co—Sb series compound of low melting point (for example, $CoSb_3$), the efficiency of the Mn—Si series compound can not be provided. The solid phase welding is suitable to a case of using materials having strength and melting point close to each other for the N-type and P-type thermoelectric elements. However, it is difficult to find joining conditions adaptable to both of the Co—Sb series compound and the Mn—Si series compound which are different from each other both in the strength and the melting point. On the contrary, according to thermal spraying, a great amount of thermoelectric elements, electrodes and the like can be joined at once in a low temperature circumstance and high strength can be obtained.

On the other hand, when a thermoelectric module is assembled by using brazing or solid phase welding, diffusion preventive layers can be formed of different elements for the P-type element and the N-type element. In this case, the diffusion preventive layer is formed, for example, by plating. For example, when $CoSb_3$ is used for the N-type element and $MnSi_{1.73}$ is used for the P-type element, it is preferred to use Nb, Ni, Fe, Cr, Sb, Ti, Mo, Zr, Cu, W, Ta and an alloy containing them as the diffusion preventive layer and use Cu, Ni, Fe or the like as the electrode. On the other hand, in the P-type element, it is preferred to use Cr, Ni, Fe, Si, Mo and an alloy containing them as the diffusion preventive layer and use Cu, Ni, Fe or the like as the electrode. Also in this case, same as the case of thermal spraying, the intermediate layer such as the diffusion preventive layer may be formed as a multi-layered structure or it can be structured to sandwich the electrode between the intermediate layer and the electrode holding layer.

Then, a second embodiment according to this invention is to be described. In this embodiment, each of N-type and P-type thermoelectric elements is formed as a segment type of a multi-layered structure.

Figure 10:
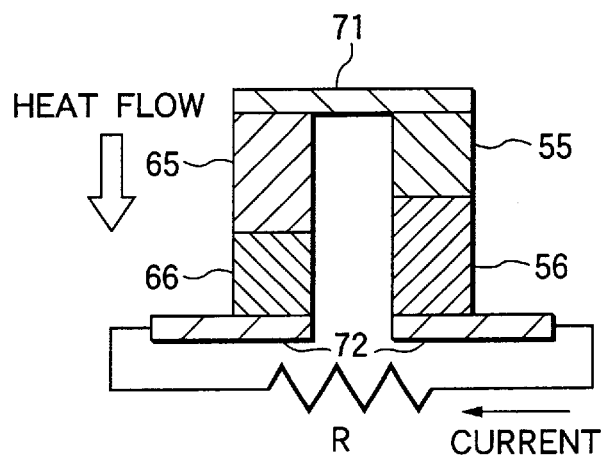
FIG. 10 is a view illustrating a thermoelectric module related to a second embodiment of this invention.

FIG. 10 shows a thermoelectric module related to this embodiment. FIG. 10 shows an example in which each of N-type and P-type thermoelectric elements has a two layered structure. $CoSb_3$ with addition of an N-type dopant is used for an N-type thermoelectric element 65 on the high temperature side, and an N-type Bi—Te series compound is used as an N-type thermoelectric element 66 on the low temperature side. On the other hand, an Mn—Si series compound with addition of a P-type dopant is used as a P-type thermoelectric element 55 on the high temperature side and a P-type Bi—Te series compound is used as a P-type thermoelectric element 56 on the low temperature side. When the thermoelectric element on the high temperature side and the thermoelectric element on the low temperature side are connected, the elements may be connected directly with each other or may be connected by way of a junction layer or a diffusion preventive layer between these elements.

Figure 11:
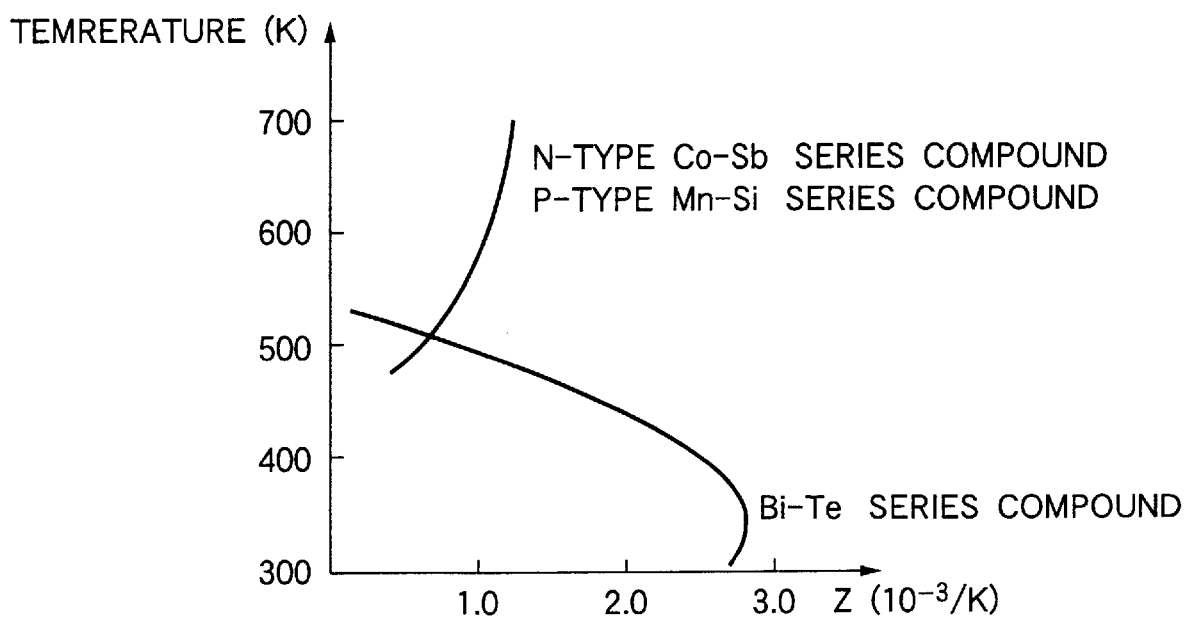
FIG. 11 is a graph showing the performance index of the thermoelectric element used for the thermoelectric module related to the second embodiment of this invention.

As described above, different materials are used for the high temperature side and the low temperature side, because the temperature characteristic of the performance index Z differs depending on the material, and suitable material is present for each of the temperatures as shown in FIG. 11. With such a constitution, the thermoelectric conversion efficiency of the thermoelectric module can be improved more compared with the case of forming the entire thermoelectric element with a single material.

The N-type thermoelectric element 65 on the high temperature side and the P-type thermoelectric element 55 on the high temperature side are connected by way of an electrode 71. Further, when the N-type thermoelectric element 66 on the low temperature side and the P-type thermoelectric element 56 on the low temperature side are connected by way of an electrode 72 to a load resistance R, electric power depending on the temperature difference between the high temperature side and the low temperature side can be taken out. Connection between the thermoelectric element and the electrode is same as that explained for the first embodiment.

Then, a third embodiment according to this invention is to be explained. In this embodiment, the unit for the thermoelectric module has a multi-layered structure and is formed into a cascade type.

Figure 12:
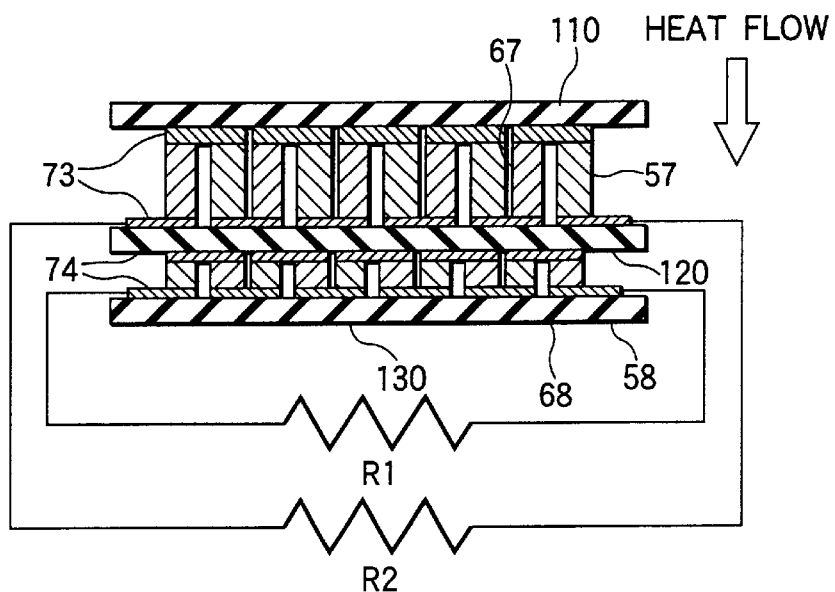
FIG. 12 is a view illustrating the thermoelectric module related to a third embodiment of this invention.

FIG. 12 shows a thermoelectric module according to this embodiment. FIG. 12 shows an example in which the unit of the thermoelectric module is constituted as a two layered structure. In the module unit on the high temperature side, $CoSb_3$ with addition of an N-type dopant is used as an N-type thermoelectric element 67 and an Mn—Si series compound with addition of a P-type dopant is used as a P-type thermoelectric element 57. On the other hand, in the module unit on the low temperature side, an N-type Bi—Te series compound is used as an N-type thermoelectric element 68 and a P-type Bi—Te series compound is used as a P-type thermoelectric element 58. Different materials are used between the high temperature side and the low temperature side because of the same reason as that for the second embodiment.

In the module unit on the high temperature side, the N-type thermoelectric element 67 and the P-type thermoelectric element 57 are disposed between ceramic plates 110 and 120 and connected by way of an electrode 73. Further, in the module unit on the low temperature side, the N-type thermoelectric element 68 and the P-type thermoelectric element 58 on the low temperature side are disposed between ceramic plates 120 and 130 and connected by way of an electrode 74. Connection between the thermoelectric element and the electrode is the same as that explained for the first embodiment When such module units are connected to load resistances R1 and R2, electric power can be taken out depending on the temperature difference in each of the module units. Alternatively, the module units may be connected in series or connected in parallel.

Then, characteristics of the N-type element and the P-type element used in the embodiments described above are to be explained.

Figure 13:
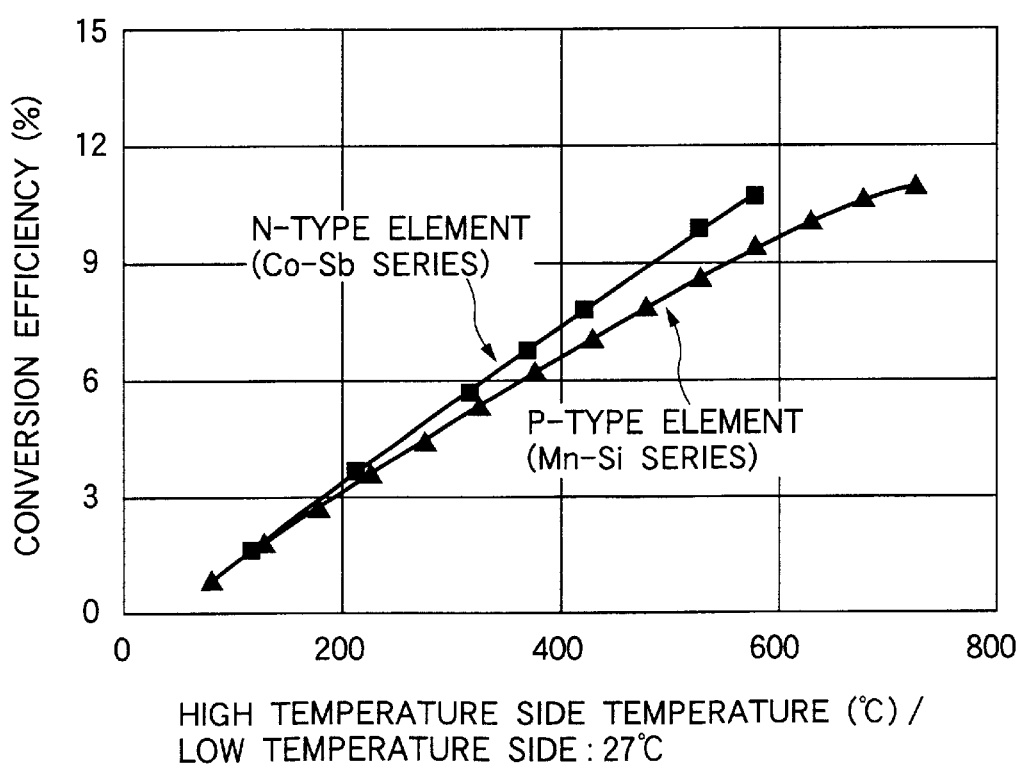
FIG. 13 is a graph showing the thermoelectric conversion efficiency of the P-type element and the N-type element used in each of the embodiments of this invention.

FIG. 13 is a graph showing a thermoelectric conversion efficiency of the Co—Sb-series N-type element and the Mn—Si series P-type element at the element level. The abscissa indicates the temperature on the high temperature side, the temperature on the low temperature side being fixed to a room temperature (27° C.). The thermoelectric conversion efficiency of the Co—Sb series N-type element shows a excellent value of about 11% at the temperature difference of 550° C. Further, the thermoelectric conversion efficiency of the Mn—Si series P-type element also shows a favorable value of about 11% at the temperature difference of 650° C.

Further, when the thermoelectric module is constituted as a combination of the Co—Sb series N-type element and the Mn—Si series P-type element as in the embodiments described above, the thermoelectric conversion efficiency of the thermoelectric module was about 10.5% at the temperature difference of 600° C. The thermoelectric conversion efficiency described above shows a larger value when compared with the thermoelectric conversion efficiency of the Si—Ge series thermoelectric module (4.6% at the temperature difference of 500° C.) or the thermoelectric conversion efficiency of the cascade module of the Si—Ge series and the PbTe—GeTe series (9.9% at the temperature difference of 687° C.). In addition, the thermoelectric module comprising the combination of the Co—Si series N-type element and the Mn—Si series P-type element has an advantage in that it is mild to the environment and obtainable at a reduced cost.

As has been described above according to this invention, it is possible to provide a thermoelectric module of using the N-type thermoelectric element having excellent characteristics in an air atmosphere even at a temperature of about 500° C. Further, the combination of excellent P-type thermoelectric material and excellent N-type thermoelectric material can improve the conversion efficiency of the thermoelectric module.

We claim:

1. A thermoelectric module comprising N-type thermoelectric elements each containing a compound having a skutterudite structure,
   P-type thermoelectric elements each connected directly or by way of a metal member to the N-type thermoelectric elements and containing an Mn—Si series compound.

2. A thermoelectric module as defined in claim 1, wherein the N-type thermoelectric element contains a Co—Sb series compound.

3. A thermoelectric module as defined in claim 2, wherein the metal member contains one of Cu, Ni and Fe.

4. A thermoelectric module as defined in claim 3, which further comprises at least one of an intermediate layer formed between the N-type thermoelectric element and the metal member, and an intermediate layer formed between the P-type thermoelectric element and the metal member.

5. A thermoelectric module as defined in claim 4, wherein the intermediate layer contains one of Mo, Ta and Cr when the intermediate layer is formed between the N-type thermoelectric element and the metal member, while the intermediate layer contains one of Nb, Mo, Ta, Pt and Cr when the intermediate layer is formed between the P-type thermoelectric element and the metal member.

6. A thermoelectric module as defined in claim 2, which further comprises at least one of an intermediate layer formed between the N-type thermoelectric element and the metal member, and an intermediate layer formed between the P-type thermoelectric element and the metal member.

7. A thermoelectric module as defined in claim 6, wherein the intermediate layer contains one of Mo, Ta and Cr when the intermediate layer is formed between the N-type thermoelectric element and the metal member, while the intermediate layer contains one of Nb, Mo, Ta, Pt and Cr when the intermediate layer is formed between the P-type thermoelectric element and the metal member.

8. A thermoelectric module as defined in claim 1, wherein the metal member contains one of Cu, Ni and Fe.

9. A thermoelectric module as defined in claim 8, which further comprises at least one of an intermediate layer formed between the N-type thermoelectric element and the metal member, and an intermediate layer formed between the P-type thermoelectric element and the metal member.

10. A thermoelectric module as defined in claim 9, wherein the intermediate layer contains one of Mo, Ta and Cr when the intermediate layer is formed between the N-type thermoelectric element and the metal member, while the intermediate layer contains one of Nb, Mo, Ta, Pt and Cr when the intermediate layer is formed between the P-type thermoelectric element and the metal member.

11. A thermoelectric module as defined in claim 1, which further comprises at least one of an intermediate layer formed between the N-type thermoelectric element and the metal member, and an intermediate layer formed between the P-type thermoelectric element and the metal member.

12. A thermoelectric module as defined in claim 11, wherein the intermediate layer contains one of Mo, Ta and Cr when the intermediate layer is formed between the N-type thermoelectric element and the metal member, while the intermediate layer contains one of Nb, Mo, Ta, Pt and Cr when the intermediate layer is formed between the P-type thermoelectric element and the metal member.

13. A thermoelectric module as defined in claim 5, wherein the intermediate layer contains one of Ta and Cr when the intermediate layer is formed between the N-type thermoelectric element and the metal member, while the intermediate layer contains one of Ta, Pt and Cr when the intermediate layer is formed between the P-type thermoelectric element and the metal member.

14. A thermoelectric module, which comprises:
a plurality of N-type thermoelectric elements electrically connected to respective P-type thermoelectric elements;
the N-type thermoelectric elements respectively containing a compound having a skutterudite structure, and
the P-type thermoelectric elements respectively containing MnSiA wherein $1.72 \leq A \leq 1.75$.

15. The thermoelectric module as defined in claim 14, wherein at least one member selected from the group consisting of Ge, Sn, Mo and Al is added in an amount up to 5 atm % as the dopant for the MnSiA which includes a following relationship: $Mn_{1-B}Mo_BSi_{A-C-D}Ge_CAl_D$ where $0 \leq B, C, D \leq 0.1$.

16. The thermoelectric module as defined in claim 14, wherein the N-type thermoelectric elements respectively contains a Co—Sb series compound.

17. The thermoelectric module as defined in claim 14, wherein the N-type thermoelectric elements are respectively directly connected to the P-type thermoelectric elements.

18. The thermoelectric module as defined in claim 14, wherein the N-type thermoelectric elements are electrically connected to the respective P-type thermoelectric elements through a metal member.

19. The thermoelectric module as defined in claim 18, wherein the metal member contains one of Cu, Ni and Fe.

20. The thermoelectric module as defined in claim 18, which further comprises at least one of an intermediate layer formed between the N-type thermoelectric element and the metal member, and an intermediate layer formed between the P-type thermoelectric element and the metal member.

21. The thermoelectric module as defined in claim 20, wherein the intermediate layer contains one of Mo, Ta and Cr when the intermediate layer is formed between the N-type thermoelectric element and the metal member, while the intermediate layer contains one of Nb, Mo, Ta, Pt and Cr when the intermediate layer is formed between the P-type thermoelectric element and the metal member.

22. A thermoelectric module, which comprises:
a plurality of N-type thermoelectric elements electrically connected to respective P-type thermoelectric elements;
the P-type thermoelectric elements respectively containing an Mn—Si series compound, and
the N-type thermoelectric elements respectively containing a compound represented by the formula: $M_{1-A}M'_AX_B$ wherein:
M is a member selected from the group consisting of Co, Rh and Ir;
M' is a dopant for forming an N-type material that is a member selected from the group consisting of Pd, Pt, and PdPt;
X is a member selected from the group consisting of As, P, and Sb; and
$0 < A \leq 0.2$ and $2.9 \leq B \leq 4.2$.

23. The thermoelectric module as defined in claim 22, wherein at least one member selected from the group consisting of Ge, Sn, Mo and Al is added in an amount up to 5 atm % as the dopant for the Mn—Si series compound which includes a following relationship: $Mn_{1-B}Mo_BSi_{A-C-D}Ge_CAl_D$ where $0<B, C, D \leq 0.1$.

24. The thermoelectric module as defined in claim 22, wherein the N-type thermoelectric elements are respectively directly connected to the P-type thermoelectric elements.

25. The thermoelectric module as defined in claim 22, wherein the N-type thermoelectric elements are electrically connected to the respective P-type thermoelectric elements through a metal member.

26. The thermoelectric module as defined in claim 25, wherein the metal member contains one of Cu, Ni and Fe.

27. The thermoelectric module as defined in claim 25, which further comprises at least one of an intermediate layer formed between the N-type thermoelectric element and the metal member, and an intermediate layer formed between the P-type thermoelectric element and the metal member.

28. The thermoelectric module as defined in claim 27, wherein the intermediate layer contains one of Mo, Ta and Cr when the intermediate layer is formed between the N-type thermoelectric element and the metal member, while the intermediate layer contains one of Nb, Mo, Ta, Pt and Cr when the intermediate layer is formed between the P-type thermoelectric element and the metal member.

29. A thermoelectric module, which comprises:
a plurality of N-type thermoelectric elements electrically connected to a plurality of P-type thermoelectric elements;
the P-type thermoelectric elements respectively containing an Mn—Si series compound, and
the N-type thermoelectric elements respectively containing a compound represented by the formula: $M(X_{1-A}X'_A)_3$ wherein:

M is a member selected from the group consisting of Co, Rh and Ir;

X is a member selected from the group consisting As, P and Sb;

X' is a member selected from the group consisting of Te, Ni and Pd; and $0 < A \leq 0.1$.

30. The thermoelectric module as defined in claim 29, wherein at least one member selected from the group consisting of Ge, Sn, Mo and Al is added in an amount up to 5 atm % as the dopant for the Mn—Si series compound which includes a following relationship: $Mn_{1-B}Mo_BSi_{A-C-D}Ge_CAl_D$ where $0 < B, C, D \leq 0.1$.

31. The thermoelectric module as defined in claim 29, wherein the N-type thermoelectric elements are respectively directly connected to the P-type thermoelectric elements.

32. The thermoelectric module as defined in claim 29, wherein the N-type thermoelectric elements are electrically connected to the respective P-type thermoelectric elements through a metal member.

33. The thermoelectric module as defined in claim 32, wherein the metal member contains one of Cu, Ni, and Fe.

34. The thermoelectric module as defined in claim 32, which further comprises at least one of an intermediate layer formed between the N-type thermoelectric element and the metal member, and an intermediate layer formed between the P-type thermoelectric element and the metal member.

35. The thermoelectric module as defined in claim 34, wherein the intermediate layer contains one of Mo, Ta and Cr when the intermediate layer is formed between the N-type thermoelectric element and the metal member, while the intermediate layer contains one of Nb, Mo, Ta, Pt and Cr when the intermediate layer is formed between the P-type thermoelectric element and the metal member.

36. A thermoelectric module, which comprises:

a plurality of N-type thermoelectric elements electrically connected to a plurality of P-type thermoelectric elements;

the P-type thermoelectric elements respectively containing an Mn—Si series compound, and the N-type thermoelectric elements respectively containing a compound represented by the formula: $M_{1-A}M'_A(X_{1-B}X'_B)_C$ wherein:

M is a member selected from the group consisting of Co, Rh and Ir;

M' is a dopant for forming N-type that is a member selected from the group consisting of Pd, Pt and PdPt;

X is a member selected from the group consisting of As, P and Sb;

X' is a member selected from the group consisting of Te, Ni and Pd; and $0 < A\ 0.2$, $0 \leq B \leq 0.1$, and $C = 3$.

37. The thermoelectric module as defined in claim 36, wherein at least one member selected from the group consisting of Ge, Sn, Mo and Al is added in an amount up to 5 atm % as the dopant for the Mn—Si series compound which includes a following relationship: $Mn_{1-B}Mo_BSi_{A-C-D}Ge_CAl_D$ where $0 < B, C, D \leq 0.1$.

38. The thermoelectric module as defined in claim 36, wherein the N-type thermoelectric elements are respectively directly connected to the P-type thermoelectric elements.

39. The thermoelectric module as defined in claim 36, wherein the N-type thermoelectric elements are electrically connected to the respective P-type thermoelectric elements through a metal member.

40. The thermoelectric module as defined in claim 39, wherein the metal member contains one of Cu, Ni and Fe.

41. The thermoelectric module as defined in claim 40, which further comprises at least one of an intermediate layer formed between the N-type thermoelectric element and the metal member, and an intermediate layer formed between the P-type thermoelectric element and the metal member.

42. The thermoelectric module as defined in claim 41, wherein the intermediate layer contains one of Mo, Ta and Cr when the intermediate layer is formed between the N-type thermoelectric element and the metal member, while the intermediate layer contains one of Nb, Mo, Ta, Pt and Cr when the intermediate layer is formed between the P-type thermoelectric element and the metal member.

* * * * *